United States Patent
Becker et al.

(10) Patent No.: US 12,235,420 B2
(45) Date of Patent: Feb. 25, 2025

(54) MULTI-ZONE DISPLAY WITH TRANSPARENCY GRADIENT

(71) Applicant: L3Harris Technologies, Inc., Melbourne, FL (US)

(72) Inventors: Jacob J. Becker, Gilbert, AZ (US); Jon D. Burnsed, Tempe, AZ (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 813 days.

(21) Appl. No.: 17/485,107

(22) Filed: Sep. 24, 2021

(65) Prior Publication Data
US 2023/0095377 A1    Mar. 30, 2023

(51) Int. Cl.
*G02B 13/16*    (2006.01)
*H10K 59/50*    (2023.01)

(52) U.S. Cl.
CPC ............ *G02B 13/16* (2013.01); *H10K 59/50* (2023.02)

(58) Field of Classification Search
CPC ......... G02B 13/16; G02B 23/12; H10K 59/50
See application file for complete search history.

(56) References Cited

U.S. PATENT DOCUMENTS

| | | |
|---|---|---|
| 6,798,578 B1 | 9/2004 | Beystrum et al. |
| 8,830,204 B2 | 9/2014 | Sultenfuss et al. |
| 12,099,179 B2 | 9/2024 | Burnsed et al. |
| 2004/0232403 A1 | 11/2004 | Sillmon et al. |
| 2019/0310724 A1 | 10/2019 | Yeke et al. |
| 2020/0364434 A1 | 11/2020 | Bok |
| 2020/0400944 A1 | 12/2020 | Burnsed et al. |
| 2021/0019491 A1 | 1/2021 | Hai et al. |
| 2021/0117644 A1 | 4/2021 | Reynolds |
| 2021/0216739 A1 | 7/2021 | Li et al. |
| 2021/0240026 A1 | 8/2021 | Yeke et al. |
| 2021/0351243 A1 | 11/2021 | Chang et al. |
| 2023/0101255 A1 | 3/2023 | Burnsed et al. |
| 2023/0102340 A1 | 3/2023 | Becker et al. |
| 2024/0353668 A1 | 10/2024 | Burnsed et al. |

(Continued)

FOREIGN PATENT DOCUMENTS

| | | |
|---|---|---|
| CN | 111624759 A | 9/2020 |
| JP | 2021-517699 A | 7/2021 |

(Continued)

OTHER PUBLICATIONS

Notice of Allowance received for U.S. Appl. No. 17/485,094, mailed on Aug. 16, 2024, 3 pages.

(Continued)

*Primary Examiner* — Donald L Raleigh
(74) *Attorney, Agent, or Firm* — NIXON & VANDERHYE P.C.

(57) ABSTRACT

A transparent optical device configured to be used with an underlying device. The underlying device is configured to provide output light. The optical device is configured to transmit light from the underlying device through the optical device. The optical device includes first and second zones. The first zone includes a first plurality of transparent regions formed in the first zone allowing light to pass through from the underlying device. The second zone includes a second plurality of transparent regions formed in the second zone which allow light in the first spectrum to pass through from the underlying device at a different transmission efficiency than the first zone.

18 Claims, 8 Drawing Sheets

(56) References Cited

U.S. PATENT DOCUMENTS

2024/0355276 A1   10/2024   Becker et al.

FOREIGN PATENT DOCUMENTS

WO   2007049213       5/2007
WO   2020/173057 A1   9/2020

OTHER PUBLICATIONS

Notice of Allowance received for U.S. Appl. No. 17/485,094, mailed on May 21, 2024, 9 pages.
European Search Report received for EP Patent Application No. 22194494.5, mailed on Feb. 13, 2023, 10 pages.
European Search Report received for EP Patent Application No. 22194736.9, mailed on Feb. 20, 2023, 5 pages.
Intention to grant received for European Patent Application No. 22194736.9, mailed on Nov. 7, 2023, 7 pages.
European Search Report received for EP Patent Application No. 22194735.1, mailed on Feb. 13, 2023, 10 pages.
U.S. Appl. No. 16/868,306, filed May 6, 2020.
Decision to Grant received for European Patent Application No. 22194736.9, mailed on Jan. 5, 2024, 2 pages.

MULTI-ZONE DISPLAY WITH TRANSPARENCY GRADIENT

BACKGROUND

Background and Relevant Art

Nightvision systems allow a user to see in low-light environments without external human visible illumination. This allows for covert vision in a low-light environment to prevent flooding the environment with human visible light and/or protects the user from being detected due to causing human visible light or light that is otherwise detectable to other nightvision systems to be emitted.

Some nightvision systems function by receiving low levels of light reflected off of, or emitted from objects and providing that light to an image intensifier (sometimes referred to as $I^2$). The image intensifier has a photocathode. When photons strike the photocathode, electrons are emitted into a vacuum tube, and directed towards a microchannel plate to amplify the electrons. The amplified electrons strike a phosphor screen. The phosphor screen is typically chosen such that it emits human visible light when the amplified electrons strike the phosphor screen. The phosphor screen light emission is coupled, typically through an inverting fiber-optic, to an eyepiece where the user can directly view the illuminated phosphor screen, thus allowing the user to see the objects.

Recent advances in night vison technology have allowed for simultaneous display of digital information overlaid on direct-view intensifier tube images. In particular, transparent and/or semi-transparent digital display chips can be placed at the output of the intensifier tubes such that light from the intensifier tubes passes through the digital display chips, while the digital display chips simultaneously display digital information to a user. These digital chips may further include detector circuits to detect light from the intensifier tube, or other sources.

Transparent display and detector chips, when used in conjunction with an image intensifier tube, rely on transmission of the underlying screen image through the chip to allow for simultaneous overlay of digital information and viewing of the nightvision scene. This results in a trade-off between tube performance and display performance with different applications necessitating different configurations. Users in some instances may require low-power always-on navigation functionality from the digital chips or in other instances low latency high frame rate video from the digital chips resulting in different displays/systems for different needs. Thus, the digital chips are often optimized for the expected functionality of a device incorporating the digital chips. Thus, the devices are typically optimized for low power applications or high-power applications, thus limiting the range of usefulness of any given device.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a transparent optical device configured to be used with an underlying device. The underlying device is configured to provide output light in a first spectrum. The transparent optical device is configured to transmit light in the first spectrum from the underlying device through the transparent optical device. The transparent optical device includes an active area of a single semiconductor chip, configured to be coupled in an overlapping fashion to the underlying device. The active area includes first and second zones. The first zone includes a first plurality of transparent regions formed in the first zone which are transparent to the light in the first spectrum to allow light in the first spectrum to pass through from the underlying device. The first plurality of transparent regions are configured in size and shape to cause the first zone to have a first transmission efficiency for light in the first spectrum. The second zone includes a second plurality of transparent regions formed in the second zone which are transparent to the light in the first spectrum to allow light in the first spectrum to pass through from the underlying device. The second plurality of transparent regions are configured in size and shape to cause the second zone to have a second transmission efficiency for light in the first spectrum, where the second transmission efficiency is different than the first transmission efficiency.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein implement transparent display chips having multiple zones, where each zone includes different display characteristics. That is, embodiments zone a single active area within a transparent display to provide multiple zones delivering different performance capabilities on a single chip. This approach ensures adequate light transmission performance through the chip while addressing multiple needs by breaking up display requirements into different zones so as to minimize the display fill factor within each pixel pitch. For example, a first zone can implement a low power static pixel architecture while a second zone can implement a high-power dynamic pixel architecture paired with an onboard light detector (e.g., to detect light from the output of an image intensifier tube). Control circuitry for both zones can be implemented on the same chip with independent control.

Disparate zones allow a single display to be designed for use in multiple applications and/or functions within a single device. Zones can have disparate characteristics including different filters per zone, different pixel arrangements per zone, different subpixel arrangements per zone (e.g., different numbers of subpixels, different layouts of subpixels, different sizes of subpixels), different transmission matching per zone, different overall power draw per zone, different brightness per zone, etc.

By having multiple disparate zones, embodiments can have several advantageous effects. For example, embodiments can implement functionality to manage screen door effects and fill factor (where needed) when using different zones to tailor image quality to usage for the user. If a certain field of view (FOV) has a certain requirement (in that zone), embodiments can be tailored for best performance. Some embodiments may be based on ocular physiology. For example, a central zone for foveal vision can be implemented with higher light transmission through that zone and having a lower fill factor with less obvious screen door effect, as compared to edge zones for peripheral vision, since the central zone is foveal for the user. The edge zones that are less critical and/or where the existence of these artifacts will be less noticeable or degrading to the usability of the device can be implemented having lower light transmission and higher fill factor as compared to the central zone. Alternatively or additionally, a central zone can have high frame rate while edge zones implement a lower frame rate. A central zone could have more color options than an edge zone. Etc.

Figure 1:
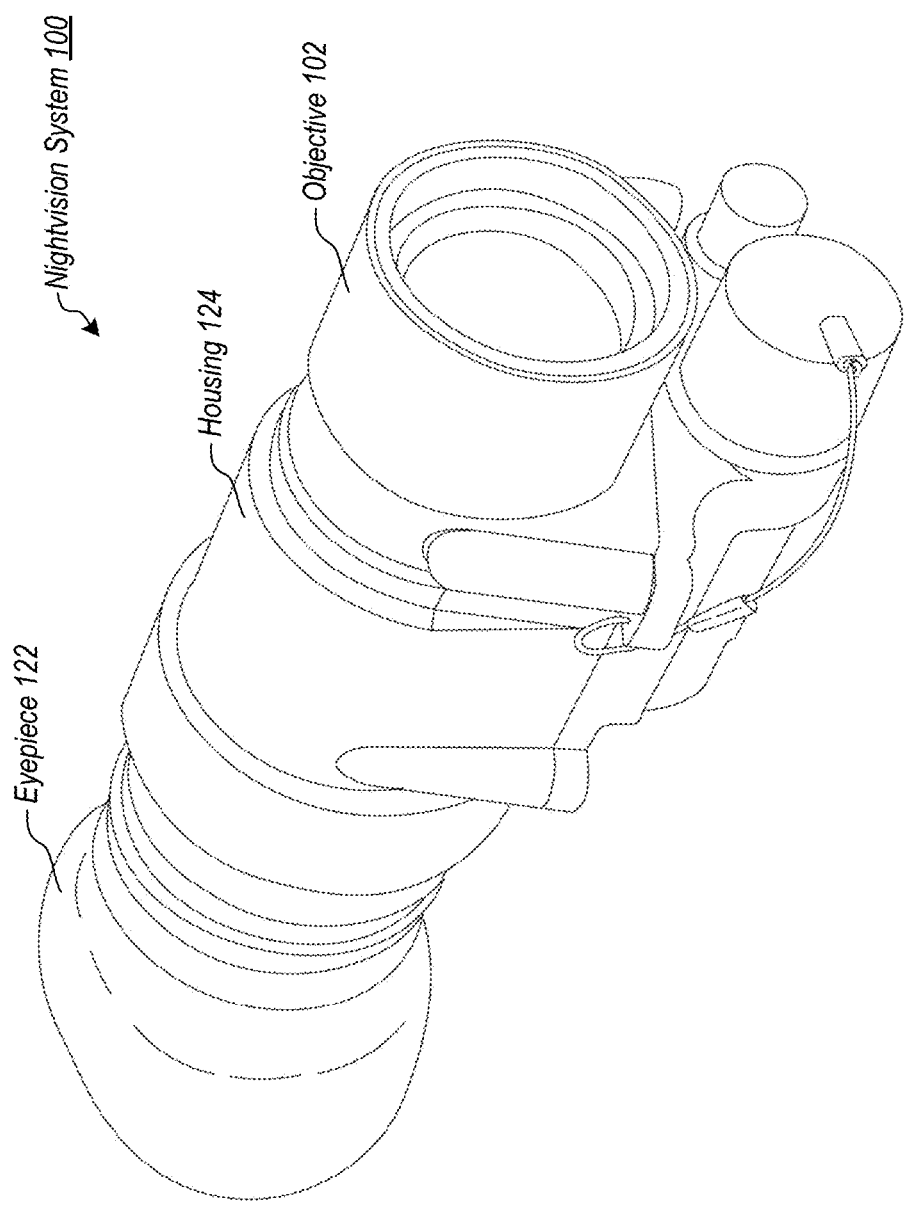
FIG. 1 illustrates a nightvision system.

Additional details are illustrated. Attention is now directed to FIG. 1, where a specific example of a nightvision system is illustrated. In particular, FIG. 1 illustrates the PVS-14 nightvision system 100. In the example illustrated, the nightvision system 100 includes a housing 124. As will be illustrated in more detail below in other figures, the housing 124 houses an image intensifier, a transparent display having multiple zones (see e.g., FIG. 3 and transparent display 318 having zones 320 and 322), and various other components. The nightvision system 100 further includes an objective 102 which receives weak light reflected and/or generated in an environment. The objective 102 includes optics such as lenses, waveguides, and/or other optical components for receiving and transmitting light to an image intensifier, discussed in more detail below. The nightvision system 100 further includes an eyepiece 122. The eyepiece 122 includes optics for focusing images created by the nightvision system 100, including images created by an image intensifier and images created by a multi-zone transparent display, into the eye of the user.

Figure 2:
FIG. 2 illustrates a nightvision scene image with heads-up display functionality.

As discussed above, and with reference to FIG. 2, modern ancillary functionality can be added to existing nightvision systems. FIG. 2 illustrates an image 200 including a heads-up display displayed on a nightvision image output from an intensifier tube. Some embodiments described herein are directed to implementing a heads-up display implemented by adding image overlay capabilities with a nightvision system, where the image overlay capabilities are added by using a multi-zone transparent display.

The heads-up display may display to the user, in or around the field-of-view of an environment, various pieces of information to create an augmented reality (AR) environment. Such information may include, for example, a navigational heading, the speed at which the user is moving, coordinates, communication messages (such as email, SMS, etc.), time of day or other timing information, vital signs for the user such as heart rate or respiration rate, indicators indicating whether an object being viewed by the nightvision system is friendly or adversarial, battery charge level for the nightvision system or other devices, weather conditions, contact information, audio information (such as volume, playlist information, artist, etc.), etc. In some embodiments, the heads-up display can superimpose thermal image data over intensified light images. In particular, a nightvision system 100 may include (or at least have access to data from) thermal cameras for detecting thermal characteristics in an environment. Data from thermal cameras can be used to control the transparent display 318 to display thermal imaging data, correlated with artifacts in intensified light images, to the user. For example, various colors can be used to represent various temperatures where the colors are output by the transparent display 318 to the user. The colors are overlaid on intensified light image artifacts to indicate temperature of objects in an environment. Note that the transparent display 318 (or other elements) may include photodetectors for detecting intensified light to determine the locations of various objects in the field of view. This information can be used for correlating thermal colors, target indicators, or other images output by the transparent display 318. Note also that due to psychovisual perception in humans, there is no need to fully colorize an intensified light image. Rather, some embodiments, can use color oversaturated grid lines, horizontal lines, diagonal lines, dots, or event text to create a perception of colorization for monochrome image intensifier images. An example of this technology is referred to as the color assimilation grid. In some embodiments, by using colored text, additional textual information can be provided when the user focuses their attention on the text, but when the user focuses on the image as a whole, the colored text will serve to simply colorize the image due to the psychovisual perception phenomenon discussed above.

Figure 3:
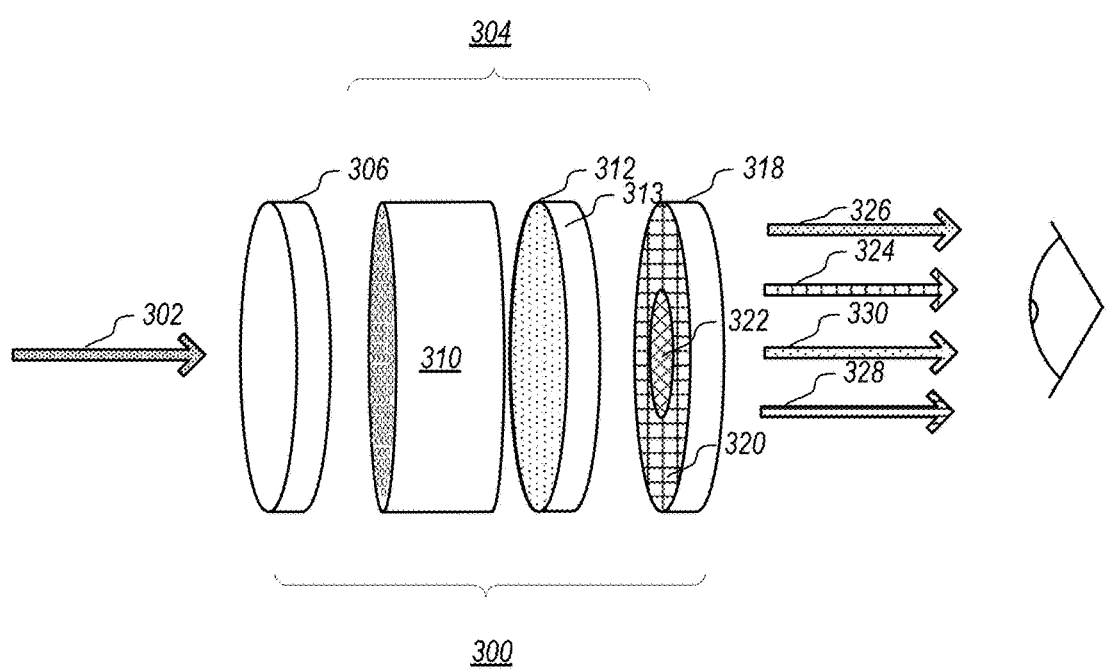
FIG. 3 illustrates a block diagram of components of a nightvision system.

Attention is now directed to FIG. 3. FIG. 3 illustrates a block diagram version of a nightvision system 300. While not shown in FIG. 3, a nightvision system typically includes an objective (such as that shown in FIG. 1 at 102) to focus input light 302 into an image intensifier 304. Such input light may be, for example, from ambient sources, such as light from heavenly bodies such as stars, the moon, or even faint light from the setting sun. Additionally, or alternatively, ambient sources could include light from buildings, automobiles, or other faint sources of light that cause reflection of light from an object being viewed in a nightvision environment into the objective. A second source of light may be light being emitted from an external source towards an object, reflected off the object, and into the objective. For example, the source may be an infrared source that is not detectable in the visual spectrum for human observers. A third source of light may be light emitted by an object itself. For example, this may be related to infrared heat energy emitted by the object and directed into the objective. Nonetheless, the nightvision system is able to convert the light emitted from the source into a viewable image for the user.

The objective directs any input light 302 into the image intensifier 304. Note that the image intensifier 304 may include functionality for amplifying light received from the objective to create a sufficiently strong image that can be viewed by the user. This may be accomplished using various technologies such as a photocathode 306, a microchannel plate 310, and a phosphor screen 312. The photocathode 306 may be configured to generate photo electrons in response to incoming photons. Electrons from the photocathode 306 are emitted into the microchannel plate 310. Electrons are multiplied in the microchannel plate 310.

Electrons are emitted from the microchannel plate 310 to a phosphor screen 312 which glows as a result of electrons striking the phosphor screen 312. This creates a monochrome image from the input light 302.

A fiber-optic 313 carries this image as intensified light to the eyepiece (such as eyepiece 122 illustrated in FIG. 1) of a nightvision system where it can be output to the user. This fiber-optic can be twisted 180 degrees to undo the inversion caused by the system objective to allow for convenient direct viewing of the screen.

FIG. 3 further illustrates the multi-zone transparent display 318. The transparent display 318 allows intensified light to pass through the transparent display 318, but also generates its own light, from LEDs or other light emitters, to transmit to a user. Creating a transparent display may be accomplished, for example, using the teachings of U.S. patent application Ser. No. 16/868,306, filed on May 6, 2020, titled "Backside Etch Process For Transparent Silicon Oxide Technology", which is incorporated herein by reference, in its entirety.

The transparent display is typically implemented behind the fiber-optic (i.e., closer to the eyepiece than the fiber-optic), but in other embodiments may be implemented in front of the fiber-optic. The use of a fiber-optic within night vision systems inverts and translates the focal plane allowing the transparent display overlay to be presented on either side without impacting the ability for the eyepiece to focus on the image. However, certain manufacturing or mechanical constraints may incentivize placement of the transparent display behind the fiber-optic including the difficulty in inserting electronics within the vacuum package. Placing the transparent display external to the fiber-optic can be done to allow the transparent display 318 to be applied after the image intensifier tube has been manufactured and sealed, lowering production difficulties. As discussed above, the transparent display 318 may include functionality for displaying information to a user. Such information may include graphical content, including text, images, and the like. In some embodiments, the transparent display 318 may display in shaded monochrome. Alternatively, or additionally, the transparent display 318 may display in multiple colors. Alternatively, or additionally, the transparent display 318 may display in 1-bit monochrome. Indeed, in some embodiments, the transparent display 318 has different zones that may have different display functionality. For example, in some embodiments, the zone 320 may display in monochrome, while the zone 322 displays in multiple colors. Indeed, in some embodiments, a given zone may not have the capabilities of another zone. For example, a monochrome display zone may be incapable of displaying in multiple colors as is possible in another zone. Alternatively, a zone may have detectors, while another zone excludes detectors, and so on.

In the example illustrated in FIG. 3, the transparent display 318 outputs display lights 326 and 330 which can be sent to the eyepiece (such as the eyepiece 122 illustrated in FIG. 1). As noted previously, the intensified light is also provided to the eyepiece. Thus, an image such as that illustrated in FIG. 2 is presented to the user in the nightvision system.

As noted previously, the transparent display 318 is composed of a number of active silicon zones having active elements. The different active elements cause the various zones to have certain optical performance capabilities. Such capabilities may be one or more of abilities to output color output, output monochrome output, detect light, have a certain pixel density, have a certain pitch, etc. In particular, the transparent display 318 is a digital display having a certain pixel density. Often, each pixel is implemented on a single active island, although in other embodiments, an island may have multiple pixels, or even only a single sub-pixel element. Each pixel has one or more transistors controlling one or more OLED emitters (or other light emitting devices). In some embodiments, pixels may additionally or alternatively include light detectors. This can be useful for detecting the intensified light from the phosphor screen 312. This detected light can be used to characterize an image intensifier image. For example, the detected light can be used for recording scene events. Alternatively or additionally, the detected light can be used for improving placement of elements displayed on the heads-up display shown in FIG. 2. For example, edge detection techniques may be used using the detected light, and images generated and displayed by the display 318 can be keyed off of these detected edges.

Thus, in some embodiments, rather than a transparent display, embodiments may implement a transparent-detector. Alternatively, embodiments may implement a transparent display that further includes detector functionality. That is, both light emitters and light detectors may be implemented in the active area of the transparent display 318. In any case, the transparent display 318 is representative of a stacked device formed in a single semiconductor chip that overlaps an underlying device, in this case, the underlying device is an image intensifier 304. The stacked device is transparent to light in a first spectrum (according to some predefined transmission efficiency), which in this case is the visible spectrum of light output by the phosphor screen 312. That is, the transparent display 318 is not fully transparent due to the blocking of the active devices, but transparency referred to herein refers to at least partial transparency according to some transmission efficiency. Note that overlapping as used herein means that elements are in the same optical path. This can be accomplished by having elements be in coaxial alignment when the optical path is straight. Alternatively, this can be accomplished by using various waveguides or other elements to align optical paths thus not requiring physical coaxial alignment.

When some embodiments implement a photodetector, the photodetector absorbs a portion of the intensified light converting it to an electrical signal. For example, the photodetector can be a two-dimensional array of light detectors, such as photodiodes, that generates a charge current, or any other form of digital data level proportional to intensity of the intensified light as a function of position. Accordingly, the photodetector may generate a two-dimensional array of electrical charge that represents the intensified image. In some embodiments, this two-dimensional array of electrical charge can be periodically read from the photodetector (e.g., the detected signal can be read from the photodetector like in a charged coupled device (CCD) camera). In some embodiments, the two-dimensional array of electrical signals from the photodetector is processed and/or used locally, e.g., within the transparent display 318 device, at the readout or pixel levels, to modulate in real time the amplitude of the display light 326 and 330.

Figure 4:
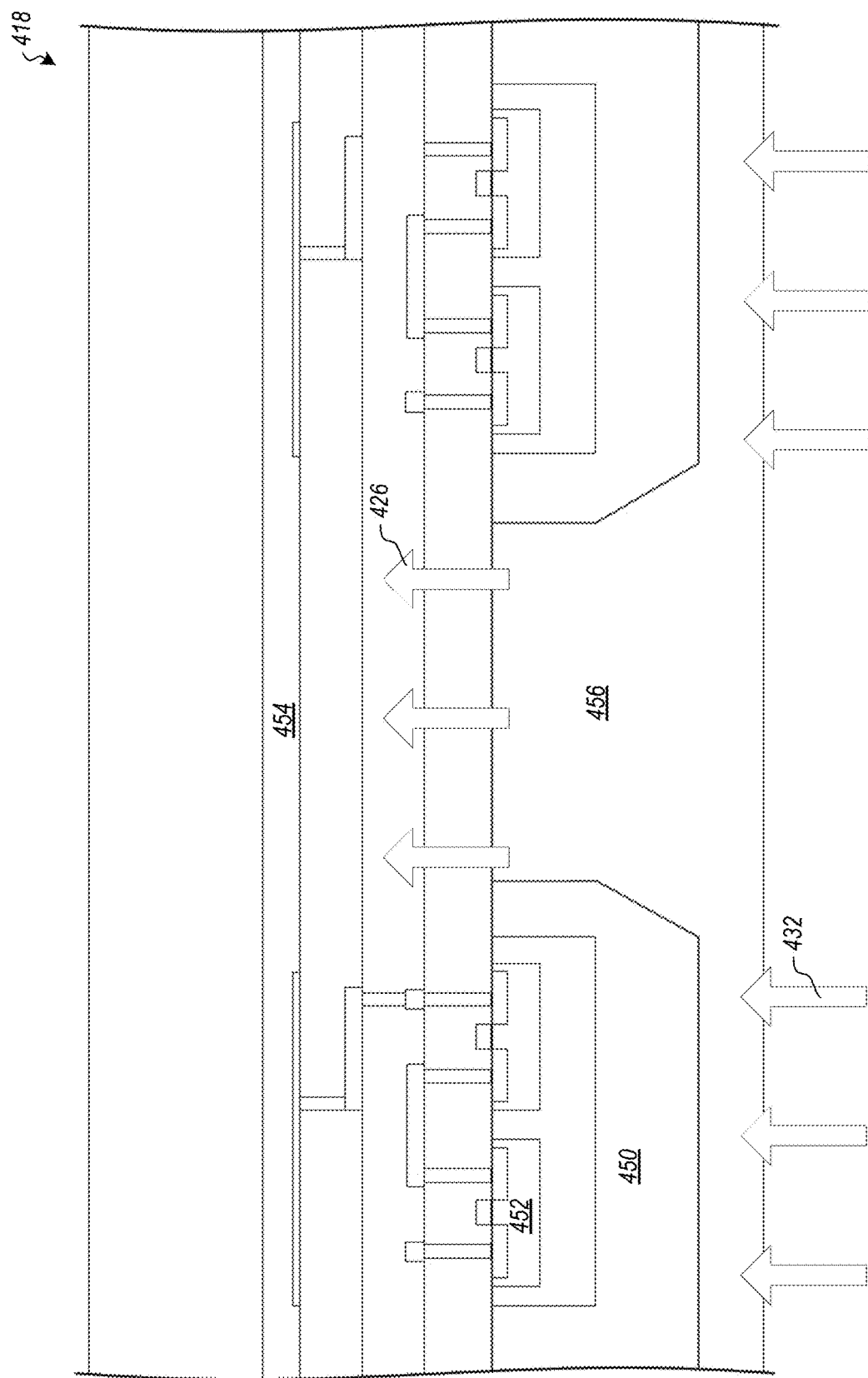
FIG. 4 illustrates a transparent display structure cross-section view, including transparent regions.

The transparent regions shown in the preceding figures can be created in a number of particular ways. In some embodiments, the transparent regions can be created by using the processes described in U.S. patent application Ser. No. 16/686,306 titled "Backside Etch Process For Transparent Silicon Oxide Technology", which is incorporated herein by reference in its entirety. Briefly, that application describes a process for creating transparent regions in otherwise opaque portions of semiconductor materials. For example, reference is now made to FIG. 4 which illustrates a transparent display 418 including active silicon islands (which may be native silicon islands) such as active silicon island 450. In particular, active silicon islands include transistors such as transistor 452 which control OLED emitters in an OLED stack 454. Note, that as alluded to above, transistors may control detectors, such as various photodiodes or other detectors, in addition or alternatively. In the example illustrated in FIG. 4, each of the active silicon islands represents a pixel or sub-pixel of the transparent display 418. Thus, by illuminating various LEDs in the OLED stack 454 using the transistors in the active silicon islands, an image can be created and output to a user, such as by outputting display light such as the display lights 326 and 330 illustrated in FIG. 3.

As illustrated in FIG. 3, intensified light is transmitted through the transparent display 318 to the eyepiece of the nightvision system, and then to the user. Note, however, that the intensified light is transmitted to the user through the transparent display 318, meaning that the intensified light will be affected by characteristics of the transparent display 318. As the transparent display 318 in the illustrated example comprises multiple zones, light emitted from different portions of the transparent display, as well as light passing through different portions of the transparent display 318, will be transmitted to a user with potentially different characteristics. In the example illustrated in FIG. 3, four types of light are illustrated. In particular, light 324 represents the light output by the light emitting portions of zone 320 of the transparent display 318. Light 326 represents intensified light from the phosphor screen 312 transmitted through the zone 320. Light 328 represents the light output by the light emitting portions of zone 322 of the transparent display 318. Light 330 represents intensified light from the phosphor screen 312 transmitted through the zone 322.

Referring once again to FIG. 4, light 426 represents a portion of light that is transmitted through transparent regions, illustrated by transparent region 456, of the transparent display 418, while light 432 represents a portion of light that is blocked by active portions of the transparent display 418. Note that in some embodiments, the transparent region 456 is backfilled with a transparent back fill material.

However, transmission of light through the transparent display is nonetheless increased by removing portions of silicon that are not needed for implementing active electrical components or for supporting metal traces. For example, consider an example where dynamic pixel cells are used. In this particular example, assume that there are two sub pixels per pixel. Anode size for the sub pixels is 8 µm×5.1 µm. Pixel area is 10.1 µm×12.4 µm. Pixel pitch is 22.5 µm×22.5 µm. In one example, this provides a resolution of 800×800. In this particular transparent display, if non-active silicon islands (not shown) that are typically implemented are not removed, transparency of the transparent display is about 33%. In contrast, transparency is about 61% if the non-active silicon islands are removed such as in the structure illustrated in FIG. 4. Thus, in this example, transparency of a transparent display is increased by more than 80% by removing silicon and/or oxide trenches.

Note that various engineering trade-offs can be made to meet certain requirements. For example, increased transparency can be obtained by having a lower resolution and/or using fewer sub pixels as there is more space between pixels and/or sub pixels. If a higher resolution is needed, then that transparent display will have a lower transparency than an equivalently sized transparent display with a lower resolution. Thus, for example, a transparent display with a 36 µm pitch can obtain a transparency of 81%, while a transparent display of 22.5 µm pitch can obtain a transparency of 67%, while a transparent display having a 17.5 µm pitch will be about 55% transparency when non-active silicon islands are removed from the transparent display in each of the illustrated examples. Thus, some embodiments may be able to create a transparent display with at least a 36 µm pitch with at least a transparency of 75%, or a transparent display of at least a 22.5 µm pitch with at least a transparency of 60%, or a transparent display having at least a 17.5 µm pitch with at least a 50% transparency when silicon is removed between active silicon islands. The preceding illustrates one specific example related to a particular manufacturing process.

Pitch and transparency values may be specific to a given semiconductor manufacturing process—also known as the technology or process node—and will of course vary as the node changes. Typically designating the process's minimum feature size, the technology node will dictate the area of required active silicon for the display CMOS based on the transistor size. As the node minimum feature size decreases, whether it be through alternate foundries or improvements in technology, the same need for maximizing transparency applies. Indeed, the benefit to removing non-active silicon islands improves as the ratio of inactive- to active-silicon increases with smaller transistors.

The example numbers described herein are derived assuming a 180 nm technology/process node, although similar calculations can be performed for any specific technology size.

Returning once again to FIG. 3, consider a case where the zone 320 implements a reduced functionality zone where fewer colors and/or lower frame rates are output as compared to zone 322. As noted above, transparency of the transparent display 318 can be affected by the number per area (corresponding to pitch) and lateral size of active components used to implement displaying portions (or detector portions) of the transparent display 318. Thus, higher functionality zones may have a natural tendency to be less transparent to intensified light than lower functionality zones. Thus, for example, in some embodiments zone 320 will be more transparent than zone 322. Further, zone 322 may output more colorful and/or more dynamic output than zone 320. Thus, various light outputs as illustrated by the lights 324, 326, 328, and 330, with differing characteristics, may be output.

Figure 5:
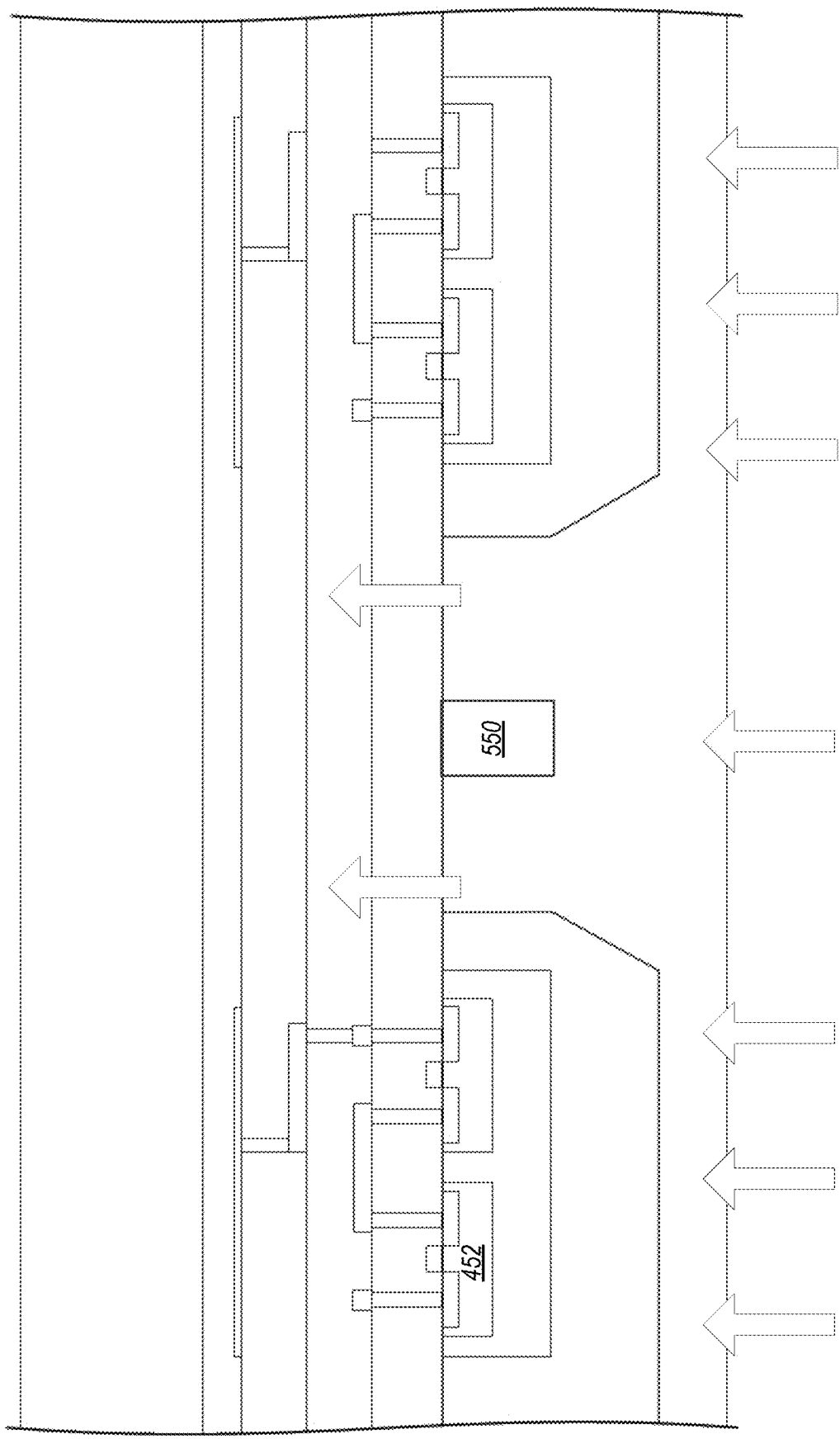
FIG. 5 illustrates the use of native silicon islands in a transparent display structure to control transparency efficiency.

It should be appreciated, however, that in some embodiments there will be a desire to maintain a similar transparency across zones. For example, embodiments may be implemented to cause the image created by the intensified light from the phosphor screen to look seamless between zones. This can be done in several different ways. For example, and with reference to FIG. 5, in some embodiments, non-active, native silicon islands 550 can be implemented in transparent regions of certain zones to block portions of the intensified light. Other regions may not have the native silicon islands, or have different configurations of native silicon islands so as to attempt to cause all zones in a device to have similar transmission characteristics with respect to transmitting intensified light through the zones. Alternatively or additionally, embodiments may implement trench width control between native silicon islands to match transmission between zones to control apparent brightness to the user. Note that while a single island 550 is illustrated in FIG. 5, it should be appreciated that embodiments may be implemented with various different silicon island numbers and configurations. Indeed, in some embodiments, transparency is determined by the ratio of $Si/SiO_2$ where native silicon tends to block visible light while silicon dioxide tends to transmit visible light.

Figure 6:
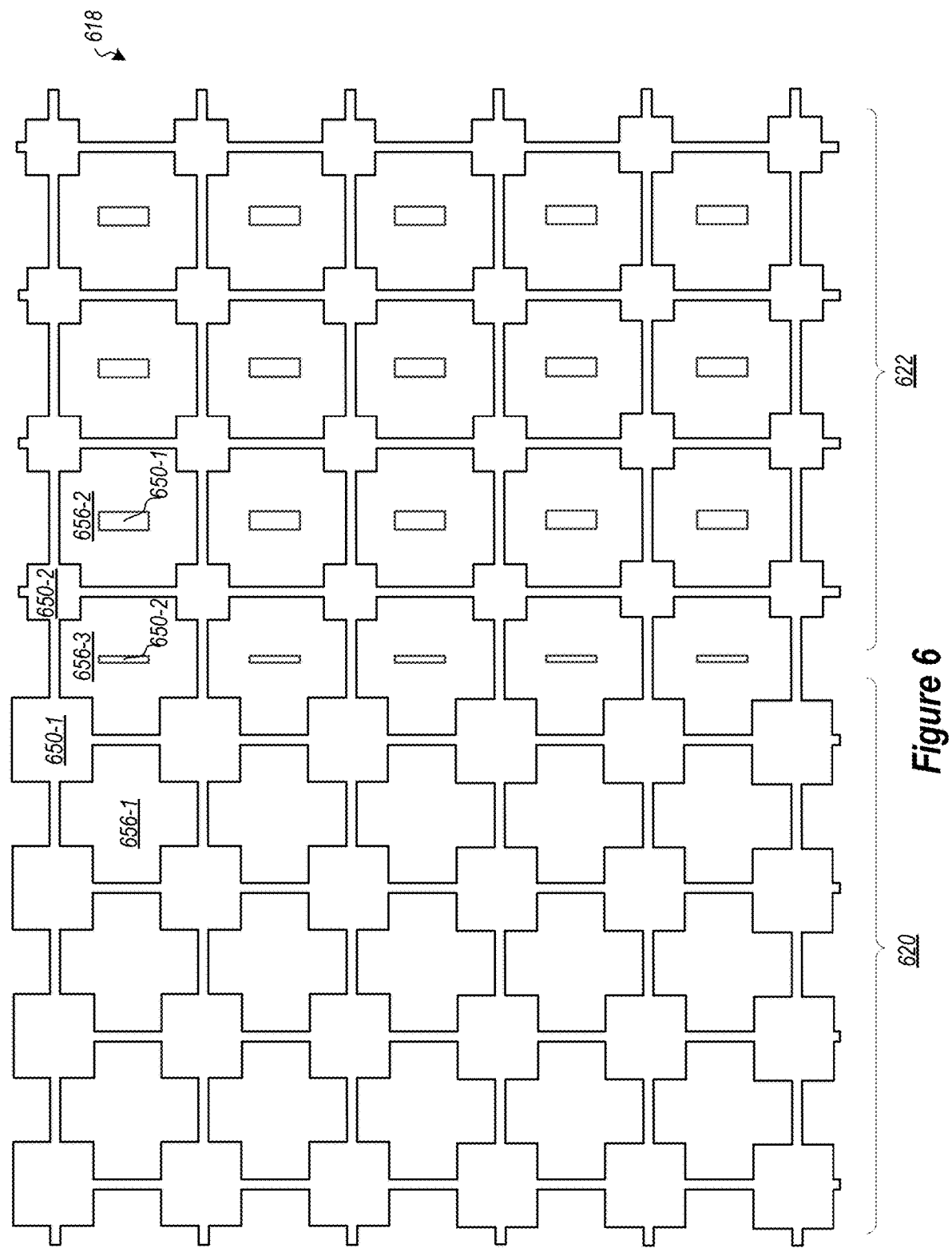
FIG. 6 illustrates top-down view of a transparent display device layout with different zones and native silicon islands to control transparency efficiency in the different zones.

Referring now to FIG. 6, an additional example is illustrated. In this example, a transparent display 618 is illustrated. The transparent display 618 includes two zones including zone 620 and zone 622. As illustrated in FIG. 6, zone 620 includes active silicon islands of a first larger size as illustrated by active silicon island 650-1, while zone 622 includes comparatively smaller active silicon islands as illustrated by active silicon island 650-2. These size differences result in transparent regions that are differently sized, and thus have differing transmissive characteristics, per zone. In particular, absent any modifications, transparent regions in zone 620, represented by transparent region 656-1, will be less transmissive than transparent regions in zone 622, represented by transparent region 656-2. However, to remedy this situation, appropriate native silicon islands, such as silicon islands represented by silicon island 650-1, can be included in the transparent regions in zone 622. As noted previously, this can be done in some cases to ensure that the transparent regions in zone 620 have the same transmission efficiency as the transparent regions in zone 622. In this way, jarring effects caused by different zones having different transmission efficiencies can be avoided.

Note that FIG. 6 further illustrates that there may be transparent regions that fall between zone 620 and zone 622. Transparent regions 656-3 is an example of such a transparent region. In these cases, the transparent regions are bounded by active silicon islands having different lateral sizes. Thus, these transparent regions have different transmission efficiencies than either the transparent regions in zone 620 or the transparent regions in zone 622. Thus, in some embodiments, different native silicon islands, as represented by native silicon islands 650-2, can be implemented to ensure that these transparent regions between different zones also have the same or similar transmission efficiency to transparent regions in the zone 620 and zone 622. Alternatively, in some embodiments no additional compensation is made for transparent regions between zones inasmuch as the area between the zones may be sufficiently small that differences in transmission efficiency will not be noticeable in these areas.

Note that while in some embodiments it is desirable to have the same transmission efficiency in transparent regions, in other embodiments it may be desirable to have different transmission efficiencies in different transparent regions. This may be true even in embodiments where active silicon islands have the same lateral size and/or functionality across different zones. For example, in some embodiments, it may be useful to have a higher transmission efficiency for zones that are more proximate a user's foveal vision; primarily configured to provide light from active elements in the zone to a user's foveal vision and/or transmit light through the zone from an underlying device to a user's foveal vision as compared to zones for peripheral vision. Thus, in the example illustrated above, zone 620 may be configured for use primarily with a user's foveal vision, while zone 622 is configured for use primarily with a user's peripheral vision. Thus, the active elements in zone 620 are configured to primarily provide light to a user's foveal vision while the active elements in zone 622 are primarily configured to provide light to a user's peripheral vision. Further the transparent regions in zone 620 are configured to transmit light from an underlying device to a user's foveal vision, while the transparent regions in zone 622 are primarily configured to transmit light from an underlying device to a user's peripheral vision. Thus, the transparent display 618 may be configured to transmit more light from an underlying device (such as an image intensifier) in zone 620 as compared to zone 622. This can be controlled by implementing appropriate $Si/SiO_2$ ratios in the appropriate transparent regions. Note that in alternative embodiments, a transparent display may be configured such that more light is transmitted to a user's peripheral vision as compared to a user's foveal vision. Similarly, embodiments may be implemented where more light is generated by active elements for a user's peripheral vision as compared to a user's foveal vision.

Note that in some embodiments, transmission efficiency may be tuned to an underlying device. For example, a particular underlying device may have characteristics whereby more light is generated in the center of the device than at the edges of the device. This may be jarring or distracting to a user. These characteristics can be corrected by controlling transmission efficiencies in the transparent display. For example, referring once again to FIG. 3, if the image intensifier 304 emits brighter lights in center regions corresponding to zone 322 then peripheral regions corresponding to zone 320, then zone 322 can have a lower transmission efficiency than zone 320 to correct for the emission differences exhibited by the image intensifier 304.

Figure 7:
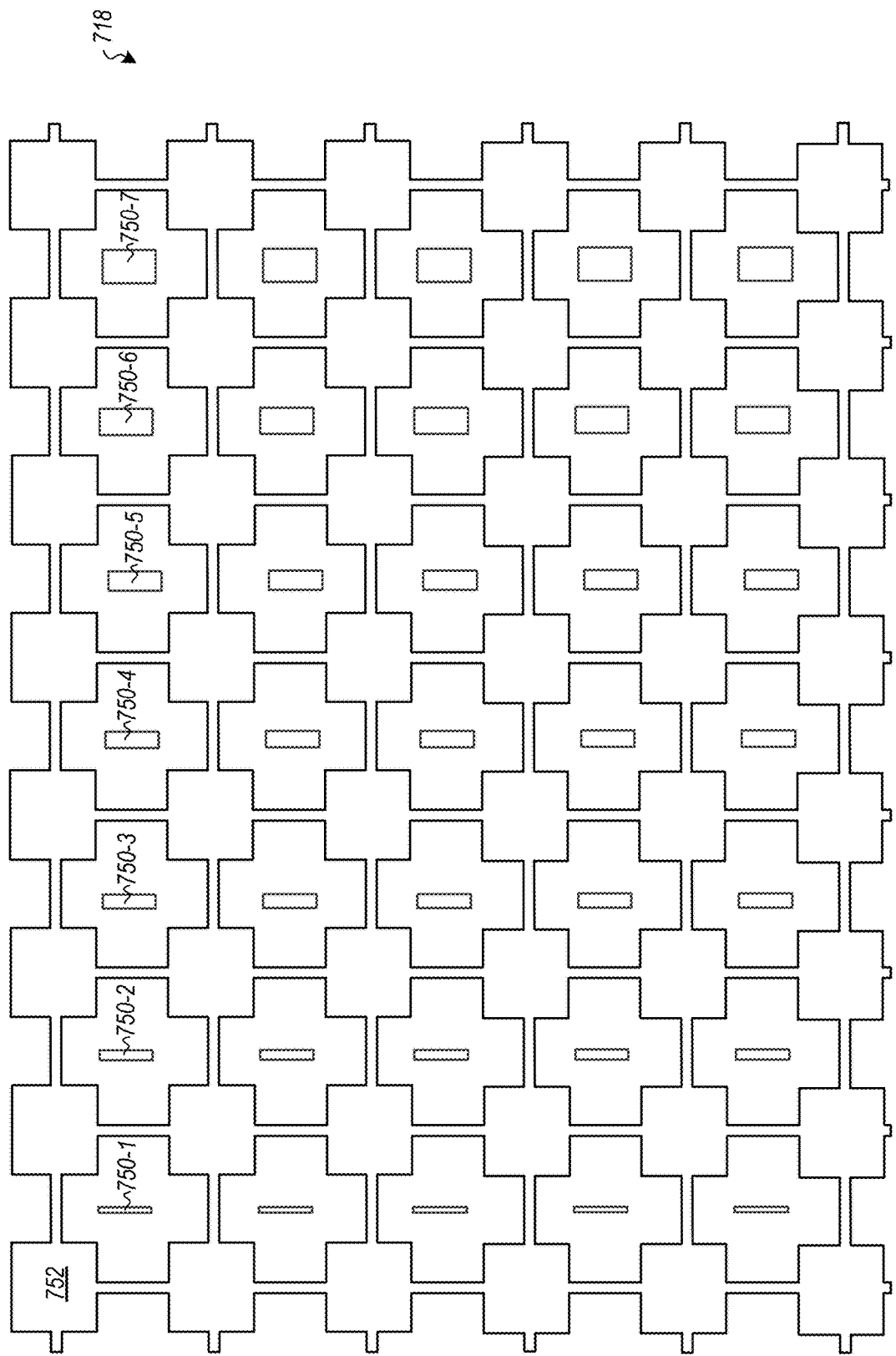
FIG. 7 illustrates a transparent display device layout with graded transparency efficiency across the transparent display device.

Note that in some embodiments, these emission characteristics can often be characterized by a gradient. Thus, for example, an image intensifier may have its brightest emission at the center of the device and its dimmest emission at the edge of the device with emissions therebetween decreasing from center to edge. Some embodiments may be implemented whereby this graded emission characteristic is corrected by a graded transparent display (or other transparent optical device). An example of this is illustrated in FIG. 7. FIG. 7 illustrates a transparent display 718. In the illustrated example, the active silicon islands (represented by active silicon islands 752) are all shown to be of the same size. However, it should be appreciated that the active silicon islands can be of various appropriate sizes depending on the application for the transparent display 718. Similarly, FIG. 7 illustrates transparent regions between the various active silicon islands. In the example illustrated in FIG. 7, the transparency efficiency of the various transparent regions is controlled by silicon islands that are graded in size. In particular, silicon islands 750-1 through 750-7 are shown with the silicon islands increasing in size from silicon island 750-1 to silicon island 750-7. Assuming that the transparent regions are of a similar size, increasing the size of the silicon islands in a graded fashion causes a corresponding reduction in transmission efficiency in a graded fashion, thus creating a gradient of transmission efficiencies.

As with examples illustrated previously herein, in some embodiments, the gradient corresponds to light emission difference characteristics of different portions of an underlying device so as to normalize transmission of light from the underlying device. Thus, for example, if the underlying device emits brighter light at the center of the device and dimmer light at the edges as compared to the center, with a gradient in-between, the transparent display 718 can be designed to compensate for the characteristics of that gradient of emitted light.

In some embodiments, the gradient corresponds to lateral size difference characteristics of active elements in different portions of a semiconductor chip so as to normalize transmission of light from an underlying device. Alternatively or additionally, the gradient may be configured to correspond to different functionalities in different zones of the semiconductor chip. This could be based on different light emitter dynamics, different light emitter colors, the presence and/or density of detector elements, etc.

In some embodiments, the gradient is configured to transmit more light in to a foveal vision of a user with decreasing transmission towards the peripheral vision of a user. In alternative embodiments, the gradient is configured to transmit more light in to a peripheral vision of a user with decreasing transmission towards the foveal vision of a user While the examples above have illustrated the use of native silicon islands to adjust transmission efficiency, in alternative or additional embodiments, thickness of Silicon-On-Insulator (SOI) structures can be controlled to tune and/or gain added light absorption. Thus, for example, different thicknesses of SOI structures can be implemented in different zones to attempt to create similar brightness across a device with multiple zones. Alternatively, different thicknesses of SOI structures can be implemented in different zones to attempt to create different brightness across a device with multiple zones. This can be used in combination with or alternative to the nonactive silicon islands illustrated previously.

Figure 8A:
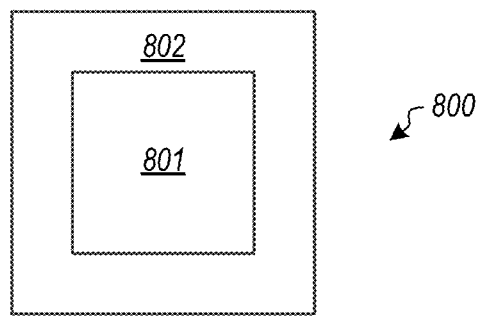
FIG. 8A illustrates an example zone configuration.
Figure 8B:
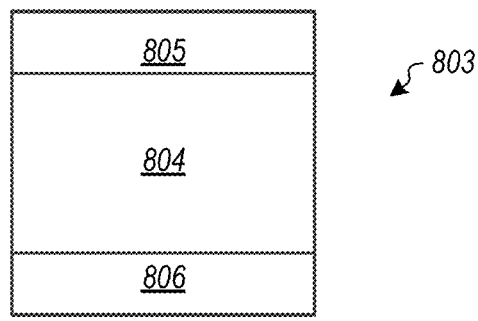
FIG. 8B illustrates an example zone configuration.
Figure 8C:
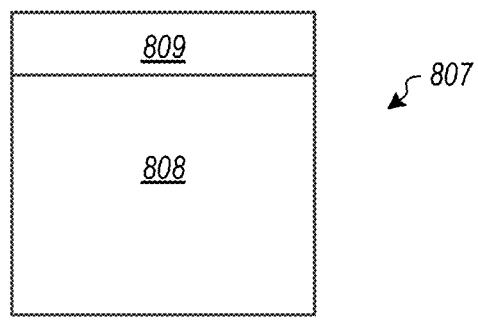
FIG. 8C illustrates an example zone configuration.

Referring now to FIGS. 8A-8C, a number of configurations are illustrated. FIG. 8A illustrates an example where a display chip 800 includes a first zone 801 and a second zone 802. In this example, the first zone 801 is in the center of the display chip 800 with the second zone 802 surrounding the first zone 801. The zones 801 and 802 have different display characteristics, such as has been illustrated and discussed above for other examples. For example, in some embodiments, the first zone 801 may be capable of displaying dynamic and/or colorful images. For example, the first zone 801 may include light emitters of multiple different colors to allow for color display. Note that in some embodiments a reasonable range of color display may be implemented by exclusively using red and green light emitters. In some embodiments, this is facilitated by virtue of the fact that other colors may be provided by other components in a system. For example, in some embodiments, a phosphor screen will emit certain blue spectrum colors which can be used in conjunction with the transparent regions of the display chip 800 to provide a pleasant experience for the user.

FIG. 8A further illustrates the second zone 802. While the first zone may support a full-color and/or dynamic display experience, the second zone 802 may support, for example, a monochromatic and/or more static in nature experience. As discussed previously, zones closer to the center of the field-of-view for the user may need to support more dynamic and/or other additional functionality as compared to zones more peripheral in the field-of-view of the user.

FIG. 8B illustrates an example of a display chip 803 with three zones, 804, 805, and 806. This example illustrates a center zone 804, and to peripheral zones 805 and 806. Again, as with the example illustrated above, different zones have different display characteristics. However, in some embodiments certain zones may have the same or similar display characteristics. For example, in the example illustrated in FIG. 8B, zones 805 and 806 may have the same display characteristics while zone 804 has different display characteristics than zones 805 and 806.

Referring now to FIG. 8C, another example is illustrated. In this example a display chip 807 has a first zone 808 and a second zone 809. This example illustrates and represents embodiments where edges of the display chip 807 may contain less functional zones for various purposes.

Some embodiments may be implemented where metallization and interconnect routing layouts are implemented in a similar fashion across zones. In particular, rather than design the pixel metallization or interconnect routing layouts unique to each zone within the multi-zone display, embodiments apply the most complex metallization and/or interconnect routing layouts to all segments to ensure similar driving strength for devices and simpler masking during manufacturing.

Figure 9:
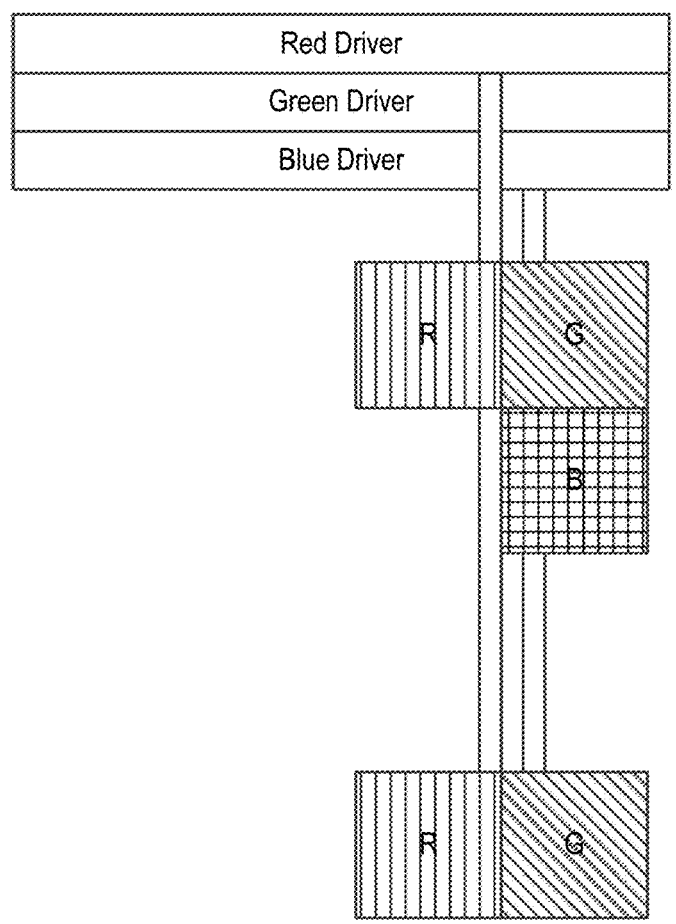
FIG. 9 illustrates an example trace layout.
Figure 10:
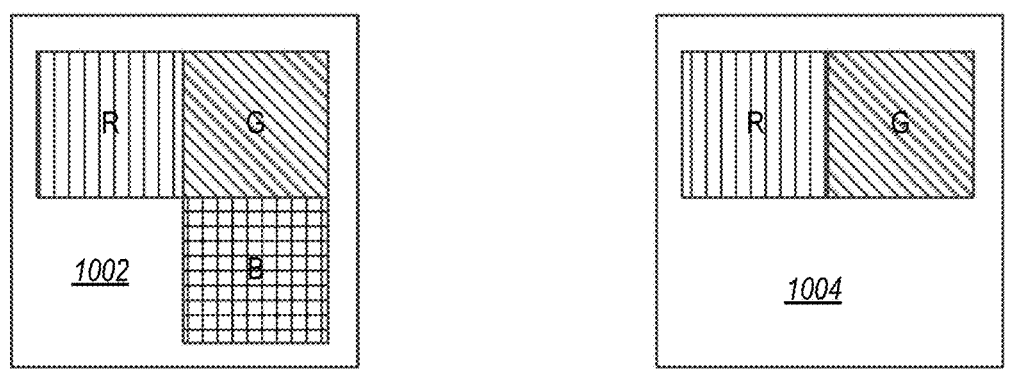
FIG. 10 illustrates an example metallization layout.

Examples are illustrated with respect to FIGS. 9 and 10. In particular, FIG. 9 illustrates an example where a first zone includes 3-color pixels, including red, green and blue sub-pixels. In contrast a second zone includes 2-color pixels including red and green sub-pixels, but excluding blue sub-pixels. Nonetheless, both zones include routing layouts from red, green, and blue drivers to the various sub-pixels. However, the traces from the blue driver to the pixels in the second zone will be unused. Note that similar embodiments may be implemented where one zone implements detectors and another zone does not. In these cases, routing layouts may nonetheless include wiring for detectors in zones where no detectors are implemented.

Similarly, attention is directed to FIG. 10, which shows similar pixel metallization in zones with different pixel configurations. For example, a first zone is shown with metallization 1002 appropriate for pixels having red, green, and blue sub-pixels. Identical metallization 1004 is implemented in a second zone which has pixels with red and green sub-pixels, but excluding blue sub-pixels.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A transparent optical device configured to be used with an underlying device, the underlying device configured to emit output light in a first spectrum, the transparent optical device configured to transmit light in the first spectrum from the underlying device through the transparent optical device, the transparent optical device comprising:

an active area of a single semiconductor chip, configured to be coupled in an overlapping fashion to the underlying device, the active area comprising:
a first zone comprising:
a first plurality of active elements; and
a first plurality of transparent regions formed in the first zone which are transparent to the light in the first spectrum to allow light in the first spectrum to pass through from the underlying device, the first plurality of transparent regions being configured in size and shape to cause the first zone to have a first transmission efficiency for light in the first spectrum; and
a second zone comprising:
a second plurality of active elements;
a second plurality of transparent regions formed in the second zone which are transparent to the light in the first spectrum to allow light in the first spectrum to pass through to the underlying device, the second plurality of transparent regions being configured in size and shape to cause the second zone to have a second transmission efficiency for light in the first spectrum, the second transmission efficiency being different than the first transmission efficiency; and
wherein the first and second zones are included in a plurality of zones with differing transmission efficiencies to create a gradient of transmission efficiencies.

2. The optical device of claim 1, wherein the gradient corresponds to light emission difference characteristics of different portions of the underlying device so as to normalize transmission of light from the underlying device.

3. The optical device of claim 1, wherein the gradient corresponds to lateral size difference characteristics of active elements in different portions of the semiconductor chip so as to normalize transmission of light from the underlying device.

4. The optical device of claim 1, wherein the gradient corresponds to different functionalities in different zones of the semiconductor chip.

5. The optical device of claim 1, wherein the gradient corresponds to different light emitter colors in different zones of the semiconductor chip.

6. The optical device of claim 1, wherein the gradient is configured to transmit more light in to a foveal vision of a user with decreasing transmission towards the peripheral vision of a user.

7. A method of manufacturing a transparent optical device configured to be used with an underlying device, the underlying device configured to emit output light in a first spectrum, the transparent optical device configured to transmit light in the first spectrum from the underlying device through the transparent optical device, the method comprising:

creating an active area of a single semiconductor chip, configured to be coupled in an overlapping fashion to the underlying device, including:
creating a first zone by:
creating a first plurality of active elements; and
creating a first plurality of transparent regions formed in the first zone which are transparent to the light in the first spectrum to allow light in the first spectrum to pass through from the underlying device, the first plurality of transparent regions being configured in size and shape to cause the first zone to have a first transmission efficiency for light in the first spectrum; and
creating a second zone by:
creating a second plurality of active elements;
creating a second plurality of transparent regions formed in the second zone which are transparent to the light in the first spectrum to allow light in the first spectrum to pass through to the underlying device, the second plurality of transparent regions being configured in size and shape to cause the second zone to have a second transmission efficiency for light in the first spectrum, the second transmission efficiency being different than the first transmission efficiency; and
creating the first and second zones in a plurality of zones with differing transmission efficiencies to create a gradient of transmission efficiencies.

8. The method of claim 7, comprising forming the gradient to correspond to light emission difference characteristics of different portions of the underlying device so as to normalize transmission of light from the underlying device.

9. The method of claim 7, comprising forming the gradient to correspond to lateral size difference characteristics of active elements in different portions of the semiconductor chip so as to normalize transmission of light from the underlying device.

10. The method of claim 7, comprising forming the gradient to correspond to different functionalities in different zones of the semiconductor chip.

11. The method of claim 7, comprising forming the gradient to correspond to different light emitter colors in different zones of the semiconductor chip.

12. The method of claim 7, comprising forming the gradient to transmit more light in to a foveal vision of a user with decreasing transmission towards the peripheral vision of a user.

13. A method of using a transparent optical device configured to be used with an underlying device, the underlying device configured to emit output light in a first spectrum, the transparent optical device configured to transmit light in the first spectrum from the underlying device through the transparent optical device, the method comprising:

coupling the transparent device to the underlying device in an overlapping fashion;
in a first zone:
using a first plurality of active elements; and
transmitting light from the underlying device using a first plurality of transparent regions formed in the first zone which are transparent to the light in the first spectrum to allow light in the first spectrum to pass through from the underlying device, the first plurality of transparent regions being configured in size and shape to cause the first zone to have the first transmission efficiency for light in the first spectrum; and
in a second zone:
using a second plurality of active elements; and
transmitting light from the underlying device using a second plurality of transparent regions formed in the second zone which are transparent to the light in the first spectrum to allow light in the first spectrum to pass through to the underlying device, the second plurality of transparent regions being configured in size and shape to cause the second zone to have a second transmission efficiency for light in the first spectrum, the second transmission efficiency being different than the first transmission efficiency; and transmitting light from the underlying device in the first and second zones in a plurality of zones with differing transmission efficiencies such that light is transmitted through a gradient of transmission efficiencies.

14. The method of claim 13, comprising transmitting light through the gradient of transmission efficiencies to correspond to light emission difference characteristics of different portions of the underlying device so as to normalize transmission of light from the underlying device.

15. The method of claim 13, comprising transmitting light through the gradient of transmission efficiencies to correspond to lateral size difference characteristics of active elements in different portions of the semiconductor chip so as to normalize transmission of light from the underlying device.

16. The method of claim 13, comprising transmitting light through the gradient of transmission efficiencies to correspond to different functionalities in different zones of the semiconductor chip.

17. The method of claim 13, comprising transmitting light through the gradient of transmission efficiencies to transmit more light in to a foveal vision of a user with decreasing transmission towards the peripheral vision of a user.

18. The method of claim 13, comprising transmitting light through the gradient of transmission efficiencies to correspond to different light emitter colors in different zones of the semiconductor chip.

* * * * *